United States Patent [19]

Fukuzako et al.

[11] Patent Number: 5,781,389
[45] Date of Patent: Jul. 14, 1998

[54] TRANSISTOR PROTECTION CIRCUIT

[75] Inventors: Shinnichi Fukuzako; Yasuhiro Fukuda, both of Tokyo, Japan

[73] Assignee: Oki Electric Industry Co., Ltd., Tokyo, Japan

[21] Appl. No.: 868,475

[22] Filed: Jun. 3, 1997

Related U.S. Application Data

[63] Continuation of Ser. No. 518,795, Aug. 24, 1995, abandoned.

[30] Foreign Application Priority Data

Sep. 14, 1994 [JP] Japan ................... 6-219943
May 10, 1995 [JP] Japan ................... 7-111599

[51] Int. Cl.$^6$ .................................. H02H 9/00
[52] U.S. Cl. ............................. 361/56; 361/111
[58] Field of Search ..................... 361/56, 91, 111

[56] References Cited

U.S. PATENT DOCUMENTS

| | | | |
|---|---|---|---|
| 4,736,271 | 4/1988 | Mack et al. | 361/91 |
| 4,811,155 | 3/1989 | Kuriyama et al. | 361/56 |
| 5,189,588 | 2/1993 | Yano et al. | 361/56 |
| 5,287,241 | 2/1994 | Puar | 361/56 |
| 5,357,393 | 10/1994 | Mojaradi et al. | 361/56 |
| 5,521,783 | 5/1996 | Wolfe et al. | 361/56 |

FOREIGN PATENT DOCUMENTS

| | | |
|---|---|---|
| 63-148671 | 6/1988 | Japan . |
| 03-148865 | 6/1991 | Japan . |

OTHER PUBLICATIONS

Patent Abstracts Of Japan, vol. 15, No. 375 (E-1114), 20 Sep. 1991 (for JP-A-03 148865, 25 Jun. 1991).

"Investigation Report on Electrostatic Breakdown of Semiconductor Devices and Method of Evaluating Same", Mar., 1995, issued by Foundation Nippon Denshi Buhin Shinraisei Senta.

*Primary Examiner*—Jeffrey A. Gaffin
*Assistant Examiner*—Michael J. Sherry

[57] ABSTRACT

The transistor protection device provides a circuit capable of obtaining a sufficient discharge characteristic when an electrostatic discharge voltage is applied to a semiconductor integrated circuit composed of a bipolar transistor. The protection device is provided across an emitter-base (E-B) junction of the bipolar transistor. When an electrostatic discharge voltage for biasing the E-B junction in the reverse direction is applied, the protection device is turned on and the surge current flows through the protection device such that the current which flows into the E-B junction of the transistor is greatly reduced so as to prevent electrostatic breakdown.

32 Claims, 2 Drawing Sheets

TRANSISTOR PROTECTION CIRCUIT

This application is a Continuation of application Ser. No. 08/518,795, filed Aug. 24, 1995, now abandoned.

BACKGROUND OF THE INVENTION

1. Field of the Invention

This invention relates to a transistor protection circuit for protecting a transistor, particularly a bipolar transistor against an electrostatic discharge applied from the outside of a semiconductor memory device.

2. Description of the Related Art

In general, a conventional transistor protection circuit had a configuration of a type wherein diodes and parasitic resistances are respectively connected between an input terminal and a source potential Vcc or between the input terminal and a ground potential Vee. This type of transistor protection circuit has been disclosed in various literatures (such as Japanese Patent Application Laid-Open Publication No. 3-148865, publication date: Jun. 25, 1991, and a report entitled "Electrostatic Breakdown Phenomenon of Semiconductor Device and Report on the Result of Investigation and Research about Method of Evaluating Its Phenomenon published by Japanese Electronic Parts Reliability Center, March 1985, etc.).

The present invention to be descried later should be understood integrally or in combination with these publications. The present invention has been made for the purpose of providing a transistor protection circuit capable of providing a sufficient discharge characteristic against an electrostatic discharge applied from the outside of an IC as compared with those disclosed in the aforementioned publications.

SUMMARY OF THE INVENTION

According to one aspect of the present invention, for achieving the above object, there is thus provided a transistor protection circuit for protecting a bipolar transistor including at least one terminal, which serves so as to bias an emitter-base junction of the bipolar transistor in the reverse direction when an electrostatic discharge is externally applied to the at least one terminal, comprising a protection element disposed and connected across the emitter-base junction.

Further, the present application discloses other various inventions made to achieve the aforementioned object. These inventions will be understood from the appended claims, the embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DETAILED DESCRIPTION OF THE PREFERRED EMBODIMENTS

A first embodiment of the present invention will hereinafter be described in detail with reference to the accompanying drawings.

Figure 1:
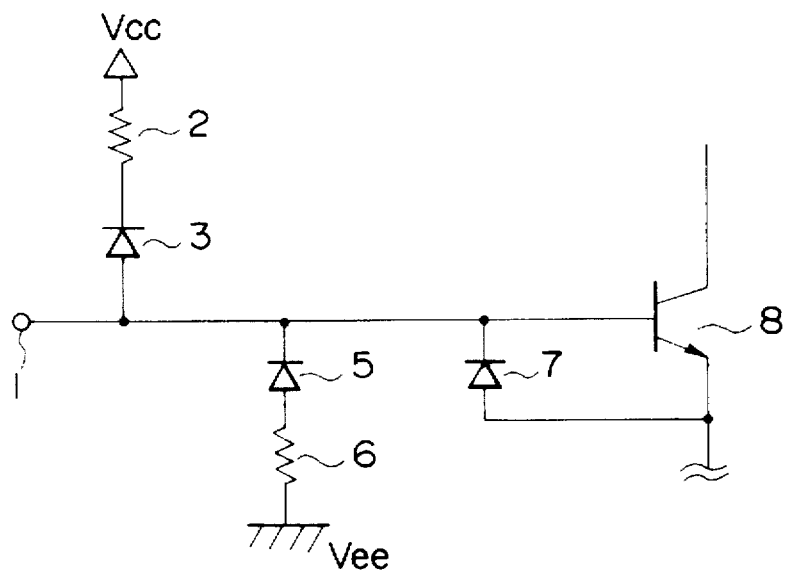
FIG. 1 is a circuit diagram showing one embodiment of a transistor protection circuit according to the present invention.

FIG. 1 shows a transistor protection circuit according to the first embodiment of the present invention.

The transistor protection circuit according to the first embodiment of the present invention comprises a diode 3 electrically connected between an input terminal 1 and a source potential Vcc, a diode 5 electrically connected between the input terminal 1 and a ground potential Vee, resistances 2 and 6 which serve as parasitic resistances of the diodes 3 and 5 respectively, and a diode 7 serving as a protection device, which is connected across an E-B junction of a bipolar transistor 8 along a direction in which the direction of the E-B junction is reversed. The diode 7 is of the same construction as a collector/base construction of the bipolar transistor 8. For example, the diode 7 can be made up of an element such as a known transistor or the like without using a new dedicated element.

The operation of the first embodiment of the present invention will now be described.

As shown in the attached reference, the E-B junction of the bipolar transistor has a generally weak resistance to an electrostatic discharge when biased is the reverse direction.

When an electrostatic discharge for biasing the E-B junction of the bipolar transistor 8 in the reverse direction is applied to the input terminal 1, the diode 7 that is in the forward direction with respect to the electrostatic discharge, is turned on. Since a parasitic resistance of the diode 7 is sufficiently low, a surge current flows through the diode 7 and is discharged therethrough. As a result, a current that flows through the reverse-biased E-B junction of the bipolar transistor 8, is greatly reduced so as to prevent electrostatic breakdown.

On the other hand, when an electrostatic discharge for biasing the E-B junction of the bipolar transistor 8 in the forward direction is applied to the input terminal 1, i.e., an electrostatic discharge for biasing the diode 7 in the reverse direction is applied to the input terminal 1, the E-B junction of the bipolar transistor 8, which is in the forward direction with respect to the electrostatic discharge, is turned on. Since the parasitic resistance of the diode 7 is sufficiently small at this time, a surge current flows into the E-B junction of the bipolar transistor 8 and is discharged therethrough. As a result, a current that flows through the diode 7 biased in the reverse direction, is greatly reduced to prevent electrostatic breakdown.

According to the first embodiment of the present invention, as described above, since a potential applied to the emitter of the bipolar transistor 8 is unequal to the ground potential Vee, it is unnecessary to use a semiconductor substrate as the anode of the diode 7. Therefore, a device having a small parasitic resistance can be used for the diode 7. Further, an advantageous effect can be brought about in that the diode 7 and the E-B junction of the bipolar transistor 8 are activated as protection devices for each other and an improvement in discharge characteristics can be made to bipolar electrostatic discharge.

Figure 3:
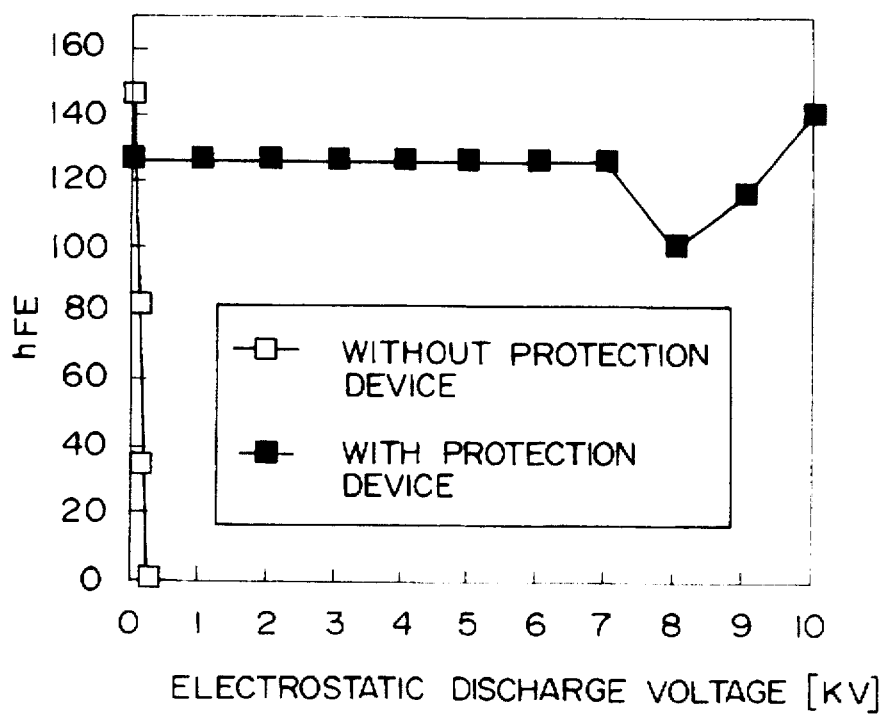
FIG. 3 is a view for describing the manner in which discharge characteristics of the transistor protection circuit according to the present invention are improved.

FIG. 3 is a comparison view showing an improvement (prevention of hFE from deterioration) in discharge characteristics, which is obtained by the first embodiment of the present invention. In FIG. 3, the axis of the ordinates represents hFE used as a characteristic comparison parameter and the axis of the abscissas represents an electrostatic discharge voltage (kV).

As is understood from FIG. 3, a bipolar transistor with the protection device (diode 7) provided across the E-B junction thereof can greatly prevent hFE from deterioration as compared with a protection device-free bipolar transistor. Namely, it is needless to say that the discharge characteristics have been improved.

A second embodiment of the present invention will now be described in detail with reference to the accompanying drawings.

Figure 2:
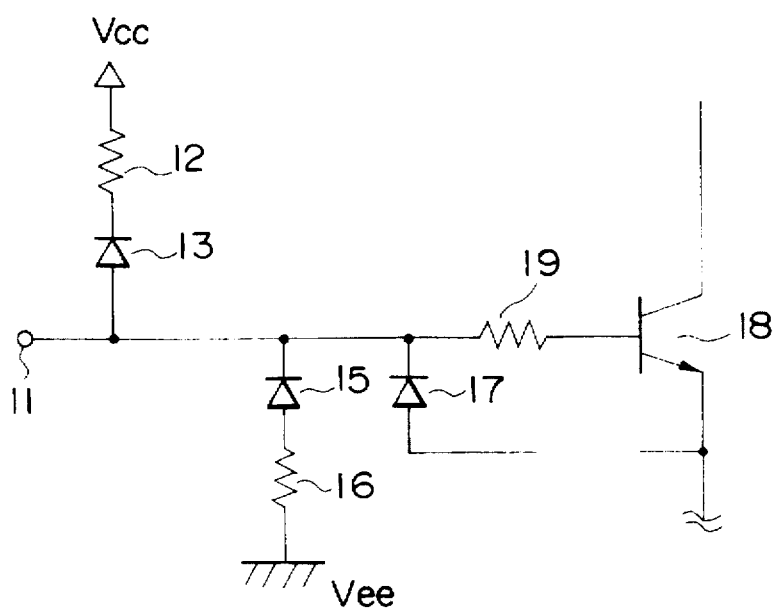
FIG. 2 is a circuit diagram illustrating another embodiment of a transistor protection circuit according to the present invention.

FIG. 2 shows a transistor protection circuit according to the second embodiment of the present invention.

The transistor protection circuit according to the second embodiment of the present invention comprises a diode 13 electrically connected between an input terminal 11 and a source potential Vcc, a diode 15 electrically connected between the input terminal 11 and a ground potential Vee, resistances 12 and 16 which serve as parasitic resistances of the diode 13 and 15 respectively, a diode 17 which-serve as a protection device electrically connected across an E-B junction of a bipolar transistor 18 in a direction opposite to the direction of the E-B junction, and a current limitation resistor 19 electrically connected between the base of the bipolar transistor 18 and the diode 17. The diode 17 is of the same construction as a collector/base construction of the bipolar transistor 18 in a manner similar to that described in the first embodiment. The diode 17 can be made up of an element such as a known transistor or the like without using a new dedicated device.

The operation of the second embodiment will now be described.

When an electrostatic discharge for biasing the E-B junction of the bipolar transistor 18 in the reverse direction is applied to the input terminal 11, the diode 17 that is in the forward direction with respect to the electrostatic discharge, is turned on. Since a parasitic resistance of the diode 17 is sufficiently low and the current limitation resistor 19 exists between the base of the bipolar transistor 18 and the diode 17, a surge current flows through the diode 17 and is discharged therethrough. As a result, a current that flows through the reverse-biased E-B junction of the bipolar transistor 18, is greatly reduced as compared with the first embodiment. Namely, an electrostatic breakdown property is improved.

A third embodiment of the present invention of the present invention will now be described in detail with reference to FIG. 4.

Figure 4:
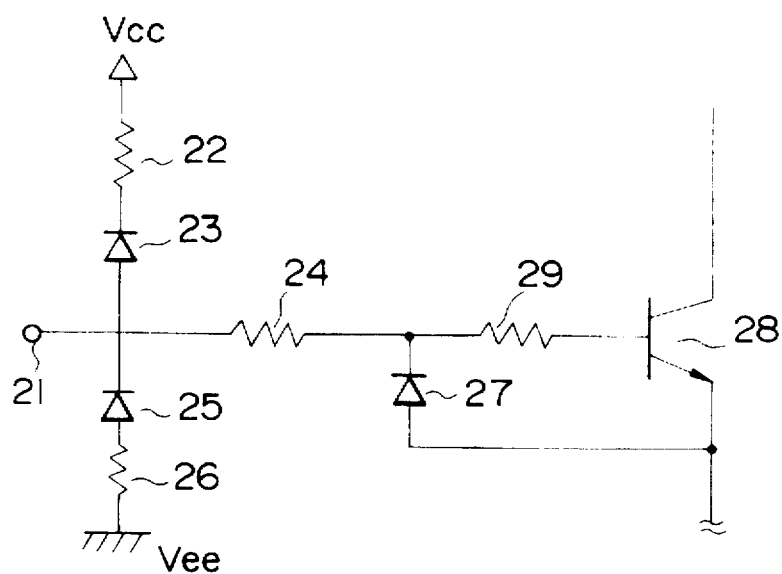
FIG. 4 is a circuit diagram showing a further embodiment of a transistor protection circuit according to the present invention.

FIG. 4 shows a transistor protection circuit according to the third embodiment of the present invention.

The transistor protection circuit according to the third embodiment of the present invention comprises a diode 23 electrically connected between an input terminal 21 and a source potential Vcc, a diode 25 electrically connected between the input terminal 21 and a ground potential Vee, resistances 22 and 26 which serve as parasitic resistances of the diodes 23 and 25 respectively, a diode 27 which serves as a protection device electrically connected across an E-B junction of a bipolar transistor 28 in a direction opposite to the direction of the E-B junction, a current limitation resistor 24 electrically connected between the input terminal 21 and the diode 27, and a current limitation resistor 29 electrically connected between the base of the bipolar transistor 28 and the diode 27. The diode 27 is of the same construction as a collector/base construction of the bipolar transistor 28 in a manner similar to that described in the first embodiment. The diode 27 can be made up of an element such as a known transistor or the like without using a new dedicated device.

The operation of the third embodiment of the present invention will now be described.

When an electrostatic discharge for biasing the E-B junction of the bipolar transistor 28 in the reverse direction is applied to the input terminal 21, a surge current flows into the diode 27 that is in the forward direction with respect to the electrostatic discharge and is discharged therethrough. On the other hand, when an electrostatic discharge for biasing the diode 27 in the reverse direction is applied to the input terminal 21, a surge current flows through the E-B junction of the bipolar transistor 28 that is in the forward direction with respect to the electrostatic discharge and is discharged therethrough. Since the current limitation resistor 24 exists between the input terminal 21 and the diode 27 at this time, it is possible to limit the flow of current through E-B junction of the bipolar transistor 28 and the diode 27. As a result, an electrostatic breakdown property against the bipolar electrostatic discharge is improved.

Although the transistor protection circuit described in the third embodiment includes the two current limitation resistors 24 and 29, it may be constructed as a protection circuit having the current limitation resistor 29 alone.

Each of the first, second and third embodiments has been described by the example in which the bipolar transistor whose base is electrically connected to the input terminal, is illustrated as the input protection circuit. In addition to this example, however, the embodiments referred to above can also be applied to E-B junctions (e.g., a circuit for biasing an E-B junction in the reverse direction when an electrostatic discharge is applied to an input) of all the bipolar transistors in an IC as measures against the electrostatic breakdown.

Further, the protection circuits described in the first, second and third embodiments are suitably selected according to purposes and uses and respectively bring about advantages that they are fit for uses and purposes.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A transistor protection circuit for protecting a bipolar transistor including at least one terminal, said bipolar transistor biasing an emitter-base junction thereof in the reverse direction when an electrostatic discharge is externally applied to said at least one terminal, comprising:

a protection device operatively directly coupled across the emitter-base junction so that the protection device protects the emitter-base junction against a negative electrostatic discharge, and the emitter-base junction protects the protection device against a positive electrostatic discharge.

2. The transistor protection circuit according to claim 1 wherein said protection device is a diode or a P-N junction of a transistor.

3. The transistor protection circuit according to claim 1, wherein said protection device is a P-N junction whose direction is opposite to the emitter-base junction.

4. The transistor protection circuit according to claim 1 wherein the protection device is of a same construction as a collector-base junction of the bipolar transistor being protected.

5. The transistor protection device according to claim 1 wherein the protection device has a small parasitic resistance.

6. The transistor protection device according to claim 1 wherein the emitter of the bipolar transistor being protected is at a voltage other than ground.

7. A transistor protection circuit for protecting a bipolar transistor having at least one terminal, an emitter and a base, said bipolar transistor biasing an emitter-base junction thereof in the reverse direction when an electrostatic discharge is externally applied to said at least one terminal, comprising:

a protection device operatively coupled to the at least one terminal and operatively directly coupled to the emitter of the bipolar transistor; and a first resistor operatively coupled between the base of the bipolar transistor and said protection device;

wherein said protection device protects the emitter-base junction against a negative electrostatic discharge, and the emitter-base junction protects said protection device against a positive electrostatic discharge.

8. The transistor protection circuit according to claim 7, wherein said protection device is a diode or a P-N junction of a transistor.

9. The transistor protection circuit according to claim 7, wherein said protection device is a P-N junction whose direction is opposite to the emitter-base junction.

10. The transistor protection circuit according to claim 7 wherein the protection device is of a same construction as a collector-base junction of the bipolar transistor being protected.

11. The transistor protection device according to claim 7 wherein the protection device has a small parasitic resistance.

12. The transistor protection device according to claim 7 wherein the emitter of the bipolar transistor being protected is at a voltage other than ground.

13. A transistor protection circuit for protecting a bipolar transistor having a base, connected to an input terminal, and an emitter, said bipolar transistor biasing an emitter-base junction thereof in the reverse direction when an electrostatic discharge is applied to the input terminal, comprising:

a protection device disposed and operatively directly coupled to both the base and the emitter of the bipolar transistor so that said protection device protects the emitter-base junction against a negative electrostatic discharge, and the emitter-base junction protects said protection device against a positive electrostatic discharge.

14. The transistor protection circuit according to claim 13, further including:

a second resistor operatively coupled between the input terminal and said protection device.

15. The transistor protection circuit according to claim 14, wherein said protection device is a diode or a P-N junction of a transistor.

16. The transistor protection circuit according to claim 14, wherein said protection device is a P-N junction whose direction is opposite to the emitter-base junction.

17. The transistor protection circuit according to claim 13, wherein said protection device is a diode or a P-N junction of a transistor.

18. The transistor protection circuit according to claim 13, wherein said protection device is a P-N junction whose direction is opposite to the emitter-base junction.

19. The transistor protection circuit according to claim 13 wherein the protection device is of a same construction as a collector-base junction of the bipolar transistor being protected.

20. The transistor protection device according to claim 13 wherein the protection device has a small parasitic resistance.

21. The transistor protection device according to claim 13 wherein the emitter of the bipolar transistor being protected is at a voltage other than ground.

22. A transistor protection circuit for protecting a bipolar transistor having a base, connected to an input terminal, and an emitter, said bipolar transistor biasing an emitter-base junction thereof in the reverse direction when an electrostatic discharge is applied to the input terminal, comprising:

a protection device operatively coupled to the input terminal and operatively directly coupled to the emitter of the bipolar transistor; and a first resistor disposed and operatively coupled between the base of the bipolar transistor and said protection device;

wherein said protection device protects the emitter-base junction against a negative electrostatic discharge, and the emitter-base junction protects said protection device against a positive electrostatic discharge.

23. The transistor protection circuit according to claim 22, wherein said protection device is a diode or a P-N junction of a transistor.

24. The transistor protection circuit according to claim 22, wherein said protection device is a P-N junction whose direction is opposite to the emitter-base junction.

25. The transistor protection circuit according to claim 22 wherein the protection device is of a same construction as a collector-base junction of the bipolar transistor being protected.

26. The transistor protection device according to claim 22 wherein the protection device has a small parasitic resistance.

27. The transistor protection device according to claim 22 wherein the emitter of the bipolar transistor being protected is at a voltage other than ground.

28. A transistor protection circuit for protecting a bipolar transistor having at least one terminal, an emitter and a base, the bipolar transistor biasing an emitter-base junction thereof in a reverse direction when an electrostatic discharge is externally applied to the at least one terminal, comprising:

a protection device operatively coupled to the at least one terminal and operatively directly coupled across the emitter-base junction of the bipolar transistor; and a diode operatively coupled between the at least one terminal and a ground potential.

29. The transistor protection device according to claim 28, wherein said protection device is a diode.

30. The transistor protection circuit according to claim 28 wherein the protection device is of a same construction as a collector-base junction of the bipolar transistor being protected.

31. The transistor protection device according to claim 28 wherein the protection device has a small parasitic resistance.

32. The transistor protection device according to claim 28 wherein the emitter of the bipolar transistor being protected is at a voltage other than ground.

* * * * *